United States Patent
Inguva et al.

(10) Patent No.: US 9,535,132 B2
(45) Date of Patent: Jan. 3, 2017

(54) SYSTEMS AND METHODS FOR DETERMINING BATTERY SYSTEM PERFORMANCE DEGRADATION

(71) Applicant: GM GLOBAL TECHNOLOGY OPERATIONS LLC, Detroit, MI (US)

(72) Inventors: Sudhakar Inguva, Troy, MI (US); Vijay P. Saharan, Grand Blanc, MI (US); Mark W. Verbrugge, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 492 days.

(21) Appl. No.: 14/220,675

(22) Filed: Mar. 20, 2014

(65) Prior Publication Data
US 2015/0268307 A1 Sep. 24, 2015

(51) Int. Cl.
| | | |
|---|---|---|
| *G01R 31/36* | (2006.01) | |
| *G01R 21/00* | (2006.01) | |
| *B60L 3/00* | (2006.01) | |
| *B60L 11/18* | (2006.01) | |

(52) U.S. Cl.
CPC ......... *G01R 31/3679* (2013.01); *B60L 3/0046* (2013.01); *B60L 11/1857* (2013.01); *B60L 11/1861* (2013.01); *B60L 11/1866* (2013.01); *G01R 31/3648* (2013.01); *B60L 2240/545* (2013.01); *B60L 2240/547* (2013.01); *B60L 2240/549* (2013.01); *B60L 2240/80* (2013.01); *B60L 2260/44* (2013.01); *G01R 31/3651* (2013.01); *Y02T 10/7005* (2013.01); *Y02T 10/7044* (2013.01); *Y02T 10/7061* (2013.01)

(58) Field of Classification Search
CPC ............ G01R 31/3679; G01R 31/3606; G01R 31/3651; G01R 31/3648; H01M 10/4207; H01M 2220/20; Y02T 10/7044; Y02T 10/7005; Y02T 10/7061
USPC ............................................... 702/57, 60, 63
See application file for complete search history.

(56) References Cited

U.S. PATENT DOCUMENTS

| | | | | |
|---|---|---|---|---|
| 8,519,674 B2* | 8/2013 | Anderson | .......... | G01R 31/3679 320/127 |
| 8,825,417 B1* | 9/2014 | Krolak | .............. | H01M 10/4207 320/134 |
| 9,172,118 B2* | 10/2015 | Marsh | ................ | G01R 31/3679 |

* cited by examiner

*Primary Examiner* — An Do
(74) *Attorney, Agent, or Firm* — Phillips Ryther & Winchester; John P. Davis

(57) ABSTRACT

System and methods for determining performance degradation of a battery system are presented. In certain embodiments, the disclosed systems and methods may involve testing, monitoring, and/or modeling of battery system cyclic performance degradation at a single battery system operating temperature. The disclosed systems and methods may offer certain efficiencies over conventional techniques for determining cyclic degradation of a battery system. Such efficiencies may allow the disclosed systems and methods to be implemented in connection with real-time battery state estimation methods.

19 Claims, 5 Drawing Sheets

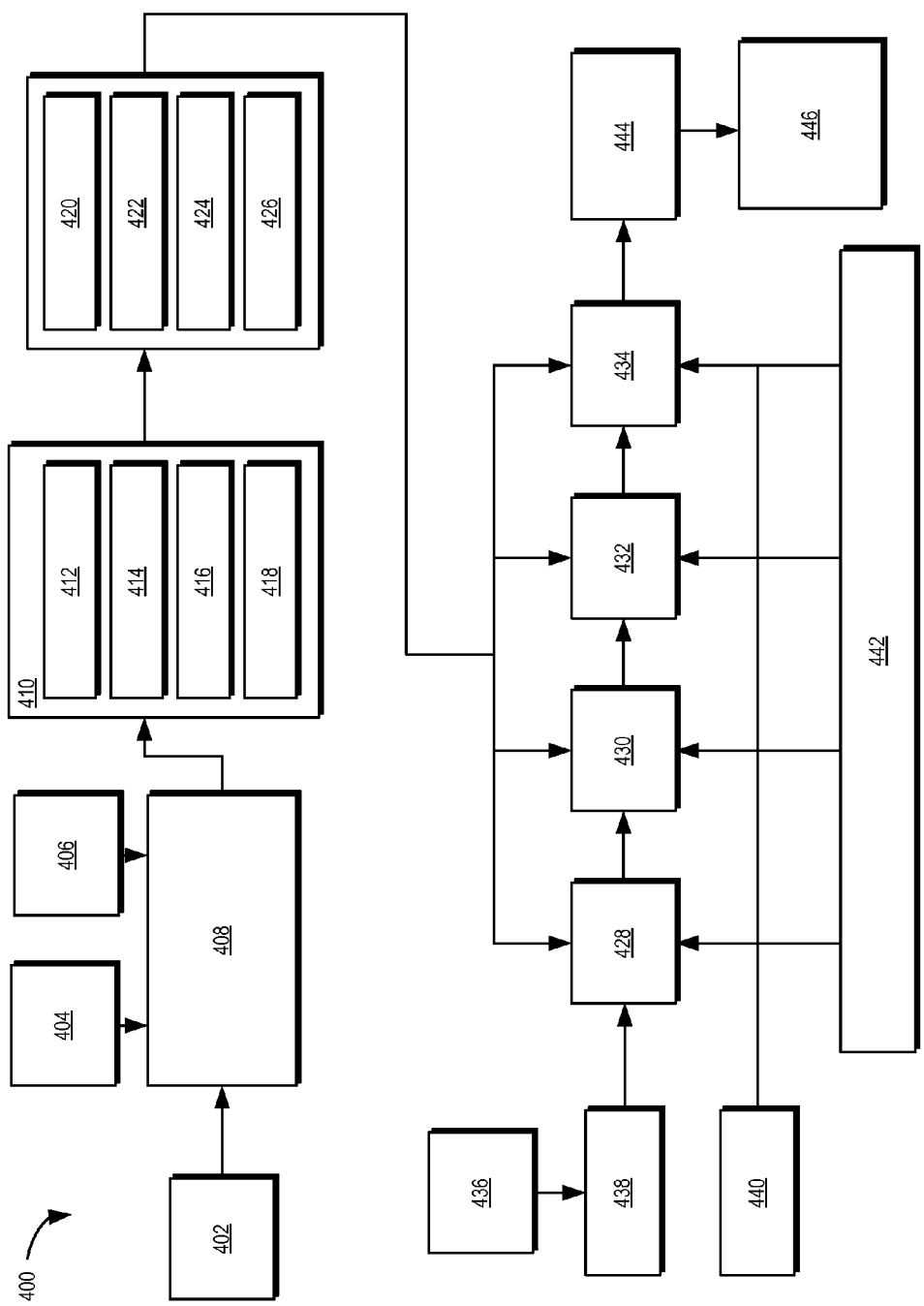

SYSTEMS AND METHODS FOR DETERMINING BATTERY SYSTEM PERFORMANCE DEGRADATION

TECHNICAL FIELD

This disclosure relates to systems and methods for determining performance degradation of a battery system. More specifically, but not exclusively, the systems and methods disclosed herein relate to determining performance degradation of a battery system in connection with battery system lifecycle modeling and/or battery system state estimation.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("ESS") included in a vehicle may be used to power electric drivetrain components of the vehicle.

Understanding how performance of a battery system may degrade overtime and/or through use may improve battery system life-cycling modeling and/or state estimation techniques. Performance degradation in a battery system may be caused by calendar-life degradation (i.e., calendric) and/or cycle-life degradation (i.e., cyclic) of the system. Conventional methods for determining battery system performance degradation may involve extensive testing of the battery system requiring testing and analysis at a variety of battery system operating temperatures. Such testing may be expensive, may involve significant investments in time, and may be difficult to use in connection with state estimation methods during real-time operation of the battery system.

SUMMARY

Systems and methods disclosed herein may provide for improved determination of information regarding battery system performance degradation. Information regarding battery system performance degradation may be utilized in connection with a variety of applications including, without limitation, battery system lifecycle modeling and/or battery system state estimation.

Consistent with embodiments disclosed herein, testing, monitoring, and/or modeling of battery system cyclic performance degradation may be performed at a single battery system operating temperature. In certain embodiments, cyclic performance degradation of a battery system may be relatively independent of the system's operating temperature. Accordingly, testing, monitoring, and/or modeling cyclic performance degradation at a single battery system operating temperature may offer certain efficiencies over testing at a plurality of operating temperatures (e.g., cost, processing, and/or time efficiencies through reduced testing, monitoring, and/or modeling) while still providing valuable information for use in connection with determining total battery system performance degradation.

In certain embodiments, a method for determining a cyclic performance degradation rate of a battery system may include receiving information indicative of total performance degradation of the battery system over a particular period and receiving information indicative of calendric performance degradation of the battery system at a plurality of operating temperatures. In some embodiments, the information indicative of calendric performance degradation may include at least one of charge depletion calendric degradation data, charge sustaining calendric degradation data, battery system rest condition calendric degradation data, and battery system recharging calendric degradation data.

Based on the information indicative of total performance degradation of the battery system and the information indicative of the calendric performance degradation of the battery system, an indication of the cyclic degradation of the battery system over the particular period may be determined. A cyclic degradation rate may be determined based on the cyclic degradation of the battery system over the particular period, and a state of the battery system (e.g., state of health, state of charge, etc.) may be estimated based on the cyclic degradation rate. In some embodiments, a battery system control action (e.g., charging and/or discharging control action) may be taken based on the cyclic degradation rate and/or the estimated state of the battery system.

In further embodiments, a method for determining a total performance degradation rate of a battery system may include determining a calendric performance degradation rate of the battery system at a plurality of operating temperatures. A cyclic performance degradation rate of the battery system may be determined at a single operating temperature. Based on the calendric performance degradation rate and the cyclic performance degradation rate, a total performance degradation rate of the battery system may be determined, and a state of the battery system (e.g., state of health, state of charge, etc.) may be estimated based on the total performance degradation rate. In some embodiments, a battery system control action (e.g., charging and/or discharging control action) may be taken based on the total degradation rate and/or the estimated state of the battery system.

BRIEF DESCRIPTION OF THE DRAWINGS

Non-limiting and non-exhaustive embodiments of the disclosure are described, including various embodiments of the disclosure with reference to the figures, in which:

FIG. 4 illustrates a conceptual diagram of a method for determining battery system performance degradation consistent with embodiments disclosed herein.

DETAILED DESCRIPTION

Figure 1:
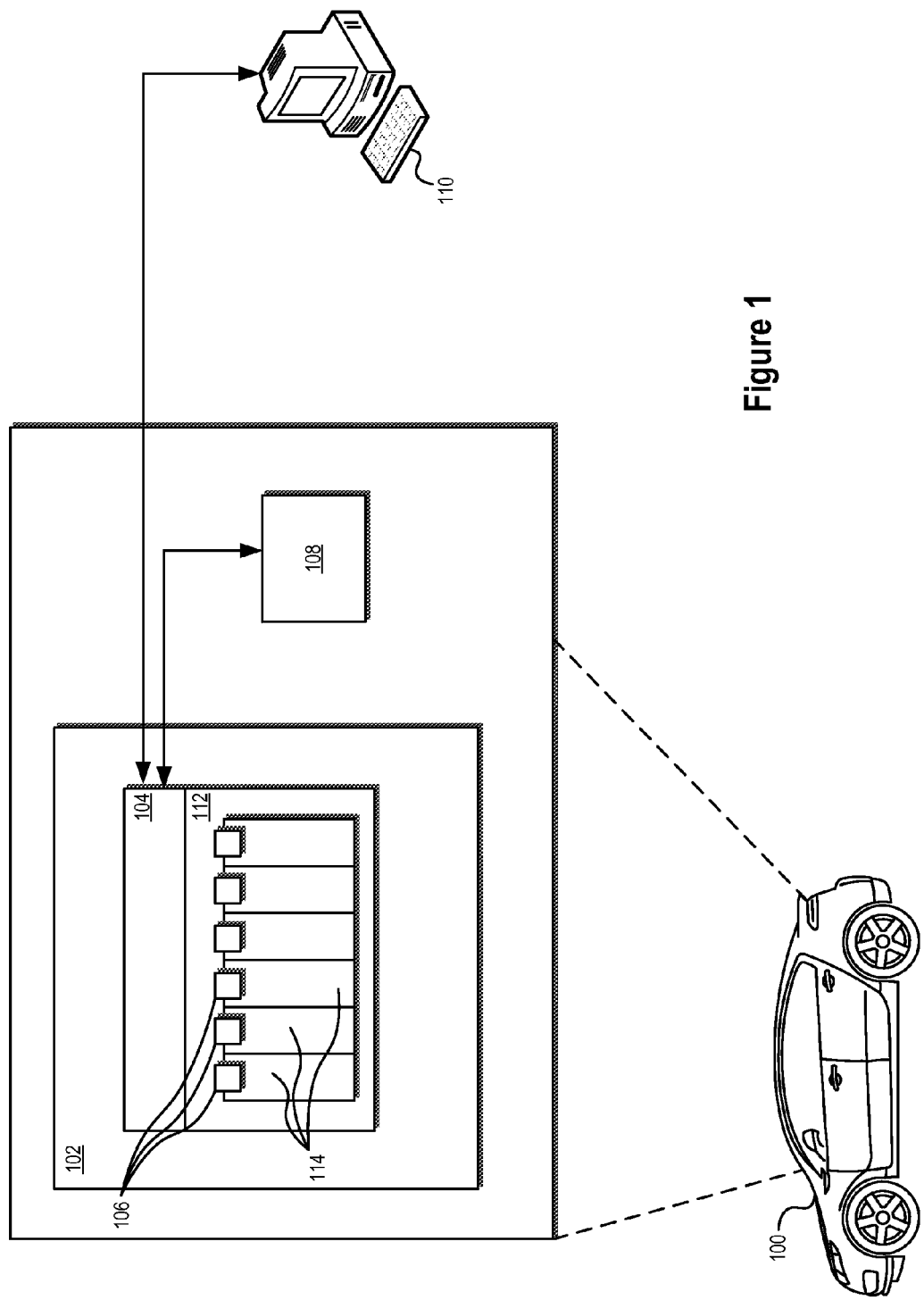
FIG. 1 illustrates an exemplary system for determining performance degradation of a battery system consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Systems and methods disclosed herein may provide for improved determination of information relating to performance degradation of a battery system. Information regarding battery system performance degradation may be utilized in connection with a variety of applications including, without limitation, battery system lifecycle modeling and/or battery system state estimation. For example, information gained from testing how a battery system's performance degrades over time and/or through various charge/discharge cycles may be utilized to better model and/or characterize the battery's performance over its operational life. Moreover, knowledge of battery system performance degradation may be utilized in connection with improving estimation of a state of the battery system including, without limitation, a state of charge ("SOC") and/or a state of health ("SOH") of the battery system. More accurate estimation of battery system state information may allow for improved battery diagnostic and/or prognostic methods and/or battery system control and/or management decisions.

Battery system performance may degrade for a variety of reasons. For example, chemical degradation and mechanical degradation of a battery system may detrimentally affect the battery system's performance. Chemical degradation may be caused by, among other things, growth of a solid electrolyte interface ("SEI") layer within the battery system. The growth of an SEI layer in a battery system and/or chemical degradation may be related to, among other things, operational temperatures of the battery system over time, SOCs of the battery system over time, and/or the like. Chemical degradation may be a cause of calendric performance degradation of a battery system—that is, performance degradation of a battery system that occurs over time (e.g., as the battery ages).

Mechanical degradation of a battery system may be caused by, among other things, particle isolation, SEI microcracking and new growth, binder loss of adhesion, delamination, diffusion induced stress, and/or other mechanisms occurring within the battery system. Mechanical degradation may be related to, among other things, operational temperatures of the battery system, SOCs of the battery system, output power of the battery system, battery system duty cycles, charge/discharge cycles of the battery system, and/or the like. Both chemical and mechanical degradation may be a cause of cyclic performance degradation of a battery system—that is, performance degradation of a battery system that occurs with use of the system (e.g., battery system charge/discharge cycles).

A battery system's total performance degradation may be associated with both calendric and cyclic-driven degradation factors. Information relating to the performance degradation of a battery system may be obtained through empirical testing, monitoring, and/or modelling of a battery system. Consistent with embodiments disclosed herein, obtained degradation information may include, without limitation, calendric performance degradation over a particular time window, calendric performance degradation during a battery system cycle period (e.g., charge/discharge cycle), calendric performance degradation during a battery system rest period, calendric degradation for a battery charge period, cyclic degradation during a battery system cycle period, and/or a normalized rate of degradation (e.g., d(degradation)/dt). In certain embodiments, such information may be fitted and/or otherwise associated with various battery system parameters (e.g., operating temperature, RMS power, SOC and/or SOH, etc.), allowing for a determination to be made as to how an associated parameter may affect the performance of the battery system. In certain embodiments, the information may be fitted with parameters that may affect battery lifecycle.

Obtaining battery system performance degradation information may involve extensive empirical testing, monitoring, and/or modeling (e.g., simulated modeling) of a battery system based on a variety of related battery system parameters (e.g., SOCs, operating temperatures, charge/recharge cycles, etc.). For example, battery system calendric and cyclic performance may be tested to determine associated performance degradation at a plurality of different battery system operating temperatures (e.g., 3-5 different operating temperatures or the like). Testing, monitoring, and/or modeling battery system calendric and cyclic performance degradation at a plurality of operating temperatures may be relatively expensive, involve significant testing and/or processing resources (e.g., increased testing type and/or cycles), and require a relatively large time investments to complete. Moreover, such a method for determining total battery system performance degradation may be difficult to implement in connection with real-time battery state estimation ("BSE") methods to estimate a SOH of a battery system given time restraints and/or processing resources of associated battery control and/or monitoring systems.

Consistent with embodiments disclosed herein, testing, monitoring, and/or modeling of battery system cyclic performance degradation may be performed at a single battery system operating temperature. In certain embodiments, battery system cyclic performance degradation may be relatively independent of battery system operating temperature. That is, cyclic performance degradation may be relatively unaffected by operating temperature of an associated battery system. In contrast, calendric performance degradation may be affected by operating temperature of an associated battery system. Accordingly, testing, monitoring, and/or modeling cyclic performance degradation at a single operating temperature may offer certain efficiencies (e.g., cost, processing, and/or time efficiencies through reduced testing, monitoring, and/or modeling) while still providing valuable information for use in connection with determining total battery system performance degradation. In some embodiments, such efficiencies may allow embodiments of the disclosed systems and methods for determining battery system performance degradation to be utilized in connection with real-time BSE methods.

FIG. 1 illustrates an exemplary system for determining performance degradation of a battery system 102 consistent with embodiments disclosed herein. In certain embodiments, the battery system 102 may be included in a vehicle 100. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. The vehicle 100 may include a battery system 102 that, in certain embodiments, may be an HV battery system. The HV battery system may be used to power electric drivetrain components (e.g., as in an electric, hybrid, or FC power system). In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like.

The battery system 102 may include a battery control system 104. The battery control system 104 may be configured to monitor and control certain operations of the battery system 102. For example, the battery control system 104 may be configured to monitor and control charging and discharging operations of the battery system 102. In certain embodiments, the battery control system 104 may be utilized in connection with the methods disclosed herein to test, monitor, and/or otherwise model battery system performance degradation (e.g., calendric and/or cyclic performance degradation). In certain embodiments, the battery control system 104 may be communicatively coupled with one or more sensors 106 (e.g., voltage sensors, current sensors, and/or the like, etc.) and/or other systems (e.g., vehicle computer system 108, external computer system 110, etc.) configured to enable the battery control system 104 to monitor and control operations of the battery system 102 and/or perform certain methods disclosed herein. For example, sensors 106 may provide battery control system 104 with information used to estimate a SOC and/or a SOH, estimate an impedance, measure a current, measure voltage of a battery pack 112 and/or constituent battery cells 114, and/or any other information that may be utilized in connection with the disclosed embodiments.

The battery control system 104 may further be configured to provide information to and/or receive information from other systems (e.g., vehicle computer system 108) included in the vehicle 100. For example, the battery control system 104 may be communicatively coupled with an internal vehicle computer system 108 and/or an external computer system 110 (e.g., via a wired and/or wireless telecommunications system or the like). In certain embodiments, the battery control system 104 may be configured, at least in part, to provide information regarding the battery system 102 (e.g., information measured by sensors 106 and/or determined by control system 104) to a user, testing personnel, service personnel, and/or the like of the vehicle 100, the vehicle computer system 108, and/or the external computer system 110. Such information may include, without limitation, battery SOC and/or SOH information, battery operating time information, battery cycle information, battery operating temperature information, and/or any other information regarding the battery system 102 that may be utilized in connection with determining performance degradation of the battery system 102.

The battery system 102 may include one or more battery packs 112 suitably sized to provide electrical power to the vehicle 100. Each battery pack 112 may include one or more battery cells 114. The battery cells 114 may utilize any suitable battery technology or combination thereof. Suitable battery technologies may include, for example, lead-acid, nickel-metal hydride ("NiMH"), lithium-ion ("Li-Ion"), Li-Ion polymer, zinc-air, lithium-air, nickel-cadmium ("Ni-Cad"), valve-regulated lead-acid ("VRLA") including absorbed glass mat ("AGM"), nickel-zinc ("NiZn"), molten salt (e.g., a ZEBRA battery), and/or other suitable battery technologies. Each battery cell 114 may be associated with sensors 106 configured to measure one or more parameters (e.g., voltage, current, temperature, etc.) associated with each cell 114. Although FIG. 1 illustrates separate sensors 106 associated with each battery cell 114, in some embodiments a sensor configured to measure various electrical parameters associated with a plurality of cells 114 may also be utilized.

Figure 2:
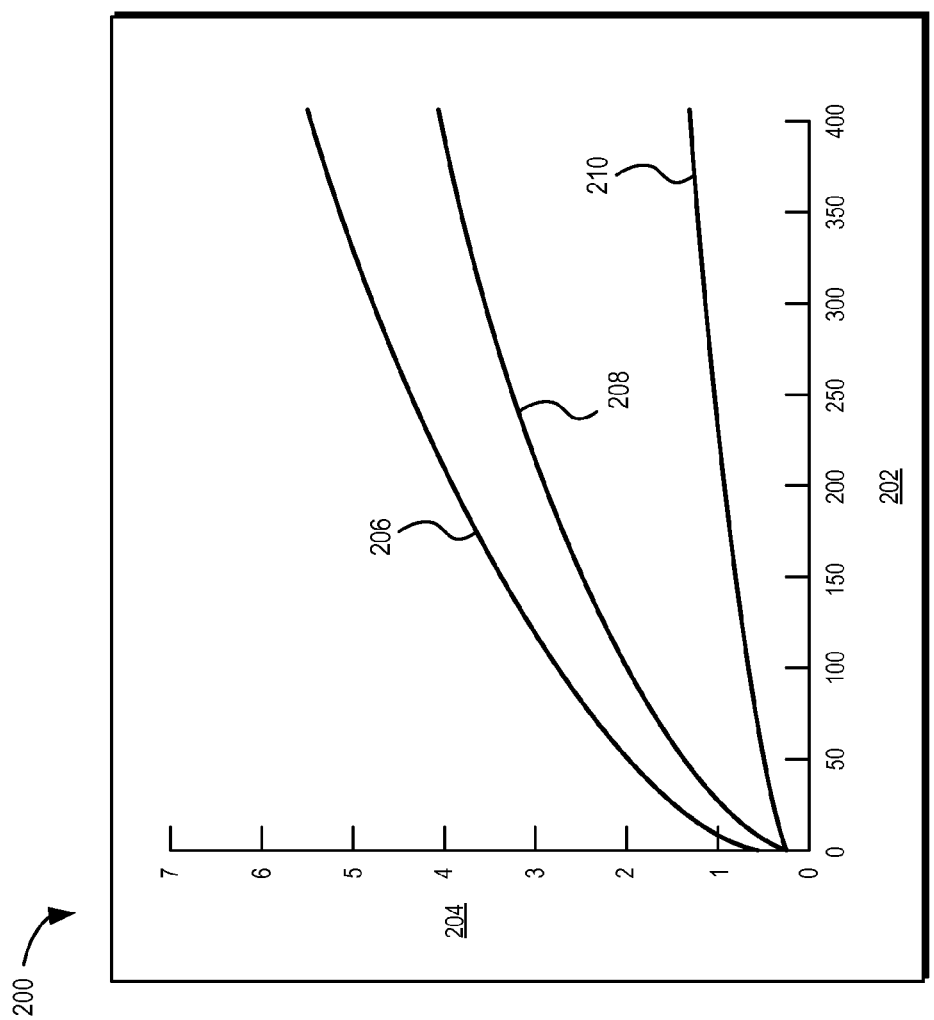
FIG. 2 illustrates a graph showing exemplary calendric performance degradation, exemplary cyclic performance degradation, and total battery performance degradation over time consistent with embodiments disclosed herein.

Information measured by sensors 106 may be provided to the battery control system 104 and/or one or more other systems (e.g., vehicle computer system 108 and/or external computer system 110). Using the information, the battery control system 104 and/or any other suitable system may coordinate the operation of battery system 102 (e.g., charging operations, discharging operations, balancing operations, etc.). The battery control system 104, vehicle computer system 108, external computer system 110, and/or any other suitable system may further utilize such information in connection with the disclosed embodiments to determine total performance degradation, calendric performance degradation, and/or cyclic performance degradation of the battery system 102 as part of testing, characterization, monitoring, and/or modeling activities. FIG. 2 illustrates a graph 200 showing exemplary calendric performance degradation, exemplary cyclic performance degradation, and total battery performance degradation over time consistent with embodiments disclosed herein. The x-axis 202 represents time and the y-axis 204 represents performance degradation of the battery system (e.g., performance degradation measured in terms of Q(t)/Q0, where Q(t) is the capacity at time t with units of Ahr and Q0 is the rated capacity of the new battery). As discussed above, a battery system's total performance degradation, indicated by line 206, may be associated with the sum of both calendric and cyclic-driven degradation factors, respectively indicated by lines 208 and 210.

Determining total performance degradation of a battery system may involve determining both calendric and cyclic performance degradation of the system using empirical testing, monitoring, and/or modeling of the system. Consistent with embodiments disclosed herein, testing, monitoring, and/or modeling of a battery system in connection with determining cyclic performance degradation may be performed at a single battery system operating temperature. Calendric performance degradation may be tested, monitored, and/or modeled at a plurality of battery system operating temperatures, as calendric degradation may be more dependent on operating temperature. Testing, monitoring, and/or modeling cyclic performance degradation at a single operating temperature in connection with determining total battery system performance degradation may offer certain efficiencies. In some embodiments, such efficiencies may allow embodiments of the disclosed systems and methods to be utilized in connection with real-time BSE methods.

Figure 3B:
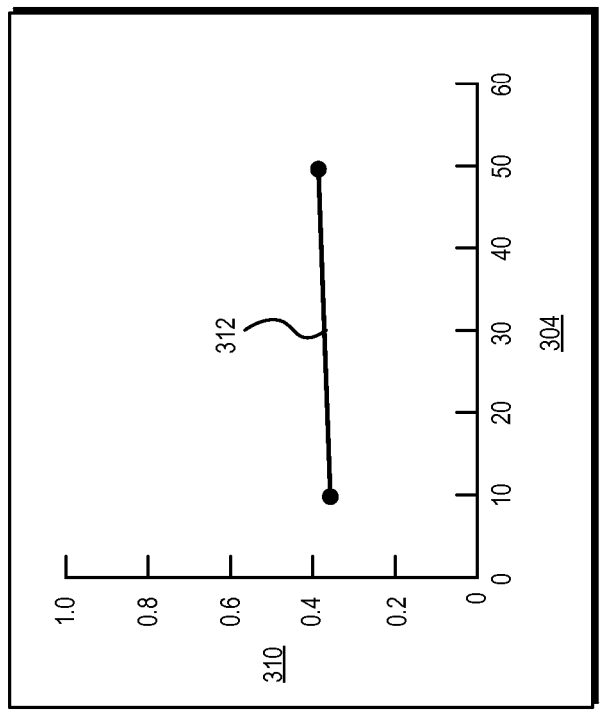
FIG. 3B illustrates a graph showing an exemplary relationship between cyclic battery performance degradation and battery operating temperature consistent with embodiments disclosed herein.
Figure 3A:
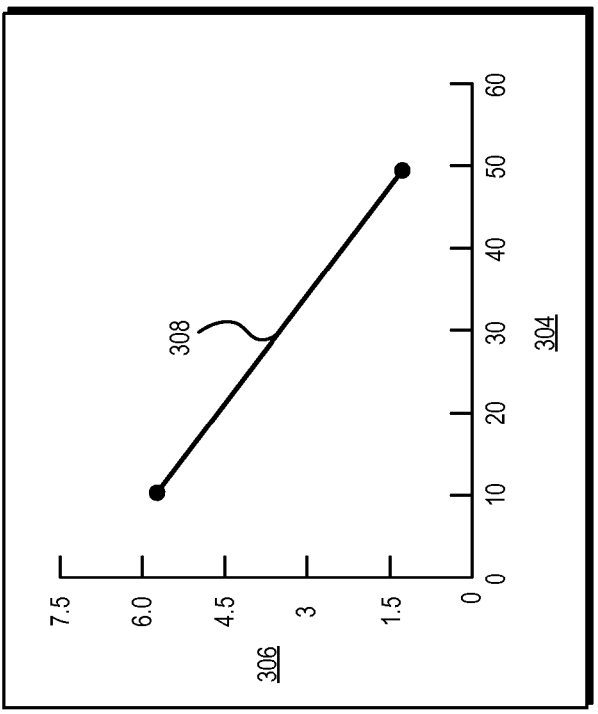
FIG. 3A illustrates a graph showing an exemplary relationship between total battery performance degradation and battery operating temperature consistent with embodiments disclosed herein.

FIG. 3A illustrates a graph 300 showing an exemplary relationship between total battery performance degradation and battery operating temperature consistent with embodiments disclosed herein. The x-axis 304 represents battery system operating temperature and the y-axis 306 represents total performance degradation of the battery system.

As illustrated, total performance degradation of the battery system, indicated by line 308, may be dependent on operating temperature of the system. As discussed above, the total performance degradation of a battery system may be associated with a sum of both calendric and cyclic-driven degradation factors. In certain embodiments, the dependency of the total performance degradation of the battery system on operating temperature may be based primarily on the calendric-driven degradation factors, as cyclic-drive factors may be relatively independent of battery system operating temperature. Accordingly, consistent with embodiments disclosed herein, in connection with determining total performance degradation of a battery system, cyclic-driven degradation factors may be tested, monitored, and/or modeled at a single operating temperature, and calendric-driven degradation factors may be tested, monitored, and/or modeled at a plurality of operating temperatures.

FIG. 3B illustrates a graph 302 showing an exemplary relationship between cyclic battery performance degradation and battery operating temperature consistent with embodiments disclosed herein. The x-axis 304 represents battery system operating temperature and the y-axis 310 represents cyclic performance degradation of the battery system. As illustrated, cyclic performance degradation of the battery system, indicated by line 312, may be relatively independent of operating temperature of the system. Given its relative independence, cyclic performance degradation of the battery system may be tested, monitored, and/or modeled at a single operating temperature with reasonable accuracy. Testing, monitoring, and/or modeling cyclic performance degradation at a single operating temperature in connection with determining total battery system performance degradation may offer certain cost, processing, and/or time efficiencies, allowing some embodiments of the disclosed systems and methods to be utilized in connection with real-time BSE methods.

FIG. 4 illustrates a conceptual block diagram of a method 400 for determining battery system performance degradation consistent with embodiments disclosed herein. In certain embodiments, one or more of the illustrated elements of method 400 may be performed by and/or implemented using a battery control system, a vehicle computer system, an external computer system, and/or any other system or combination of systems configured to test, monitor, model, and/or otherwise characterize performance degradation of a battery system. In some embodiments, the illustrated method 400 may be utilized in connection with determining cyclic performance degradation of a battery system excluding calendric degradation during cycling (e.g., a normalized cyclic performance degradation rate excluding calendric effect). For example, the illustrated method 400 may be utilized in connection with determining cyclic performance degradation of a battery system based on information relating to total performance degradation and calendric performance degradation.

A variety of data 408 may be utilized in connection with determining cyclic performance degradation. The data 408 may comprise time data, estimated core temperature data, estimated SOC data, temperature data, current data, voltage data, data associating the same, and/or any other relevant data. In some embodiments, the data 408 may comprise characterization data 402. The characterization data 402 may comprise time data, temperature data, current data, voltage data, SOC data, data associating the same, and/or other data that, in some embodiments, may be independent of a particular battery system being tested, monitored, modeled, and/or otherwise characterized using the systems and methods disclosed herein.

The data 408 may further comprise cell core temperature data 404 and SOC data 406. In certain embodiments, the temperature data 404 may be provided by a temperature estimation module generating battery system temperature data 404 based on an actual measured and/or a modeled battery system. Similarly, the SOC data 406 may be provided by a battery state estimation module generating SOC data 406 based on an estimated battery system state generated from actual battery system measurements and/or a modeled battery system.

The data 408 may be provided to a mode separation module 410. Based on a type of battery system application (e.g., applications in pure hybrid vehicles, pure electric vehicles, plug-in hybrid electric vehicles, extended range electric vehicles ("EREV"), etc.), an estimated SOC, and/or observed current data from the battery system the mode separation module 410 may generate charge depletion ("CD") data 412, charge sustaining ("CS") data 414, rest data 416, and/or recharge data 418, for the battery system. Based on the data 408 and data 412-418, CD time vs. temperature and/or SOC data 420, CS time vs. temperature and/or SOC data 422, rest time vs. temperature and/or SOC data 424, and/or recharge time vs. temperature and/or SOC data 426 may be generated.

Raw performance degradation data 436 (e.g., data obtained by testing, monitoring, modeling, and/or otherwise characterizing the performance of a battery system) may be utilized to determine a degradation state 438 at the beginning of a particular period (e.g. a particular day). The degradation state 438, CD time vs. temperature and/or SOC data 420, CS time vs. temperature and/or SOC data 422, rest time vs. temperature and/or SOC data 424, and/or recharge time vs. temperature and/or SOC data 426 may be provided to a series of modules 428-434 configured to remove certain calendric degradation factors from the degradation state 438. In certain embodiments, modules 428-434 may further receive information from a degradation model 442. In certain embodiments, the degradation model 442 may be dependent on an initial degradation state and an incremental time, and may be expressed according to the following:

$$\% \, \Delta Deg_j = \frac{1}{L_j^a} * \left[ \left( (100 - D_j)^{\left(\frac{1}{a}\right)} * L_j + X^{\left(\frac{1}{a}\right)} \Delta t \right)^a - (100 - D_j) * L_j^a \right] \quad \text{Eq. 1}$$

Where

'Dj' is a current or instantaneous state of capacity

'a' is the time dependent exponent for an instantaneous condition 'j'

'Lj' is the end of life in years for 'X %' degradation for the condition 'j'

'Δt' is a small time increment (of the order of 1 second) in units of years

It will be appreciated that the degradation module 442 may be expressed in a variety of other ways in connection with the disclosed embodiments. In further embodiments, calendar life test data and/or data mapping temperature vs. SOC of a tested, monitored, and/or modeled battery system 440 may be provided to modules 428-434 for use in connection with the disclosed embodiments.

Module 428 may remove CD calendric degradation from the degradation state 238, module 430 may remove CS calendric degradation from the degradation state 238, module 432 may remove rest calendric degradation from the degradation state 238, and module 434 may remove recharge calendric degradation from the degradation state 238. The output 444 of modules 428-434 may comprise an indication of cyclic degradation at the end of the period (e.g., a periodic degradation rate) associated with degradation state 438 (e.g., a day). The cyclic degradation at the end of the period 444 may be used to determine a normalized rate of cyclic degradation 446 for the battery system (e.g., d(degradation)/dt). In certain embodiments, the normalized rate of degradation 446 may be expressed according to:

$$\frac{dDeg}{dt} = \frac{(D_T - D_{CD} - D_{CS} - D_R - D_{RC})}{DutyCycle} \quad \text{Eq. 1}$$

where $$\frac{dDeg}{dt}$$

is the normalized rate of degradation, $D_T$ is the total degradation, $D_{CD}$ is the CD calendric degradation, $D_{CS}$ is the CS calendric degradation, $D_R$ is the calendric rest degradation, $D_{RC}$ is the calendric recharge degradation, and Duty Cycle is the duty cycle associated with the period associated with the degradation state 238.

It will be appreciated that a number of variations can be made to the architecture and relationships of the elements presented in connection with FIG. 4 within the scope of the inventive body of work. Thus it will be appreciated that the architecture and relationships of the elements illustrated in FIG. 4 are provided for purposes of illustration and explanation, and not limitation.

Figure 5:
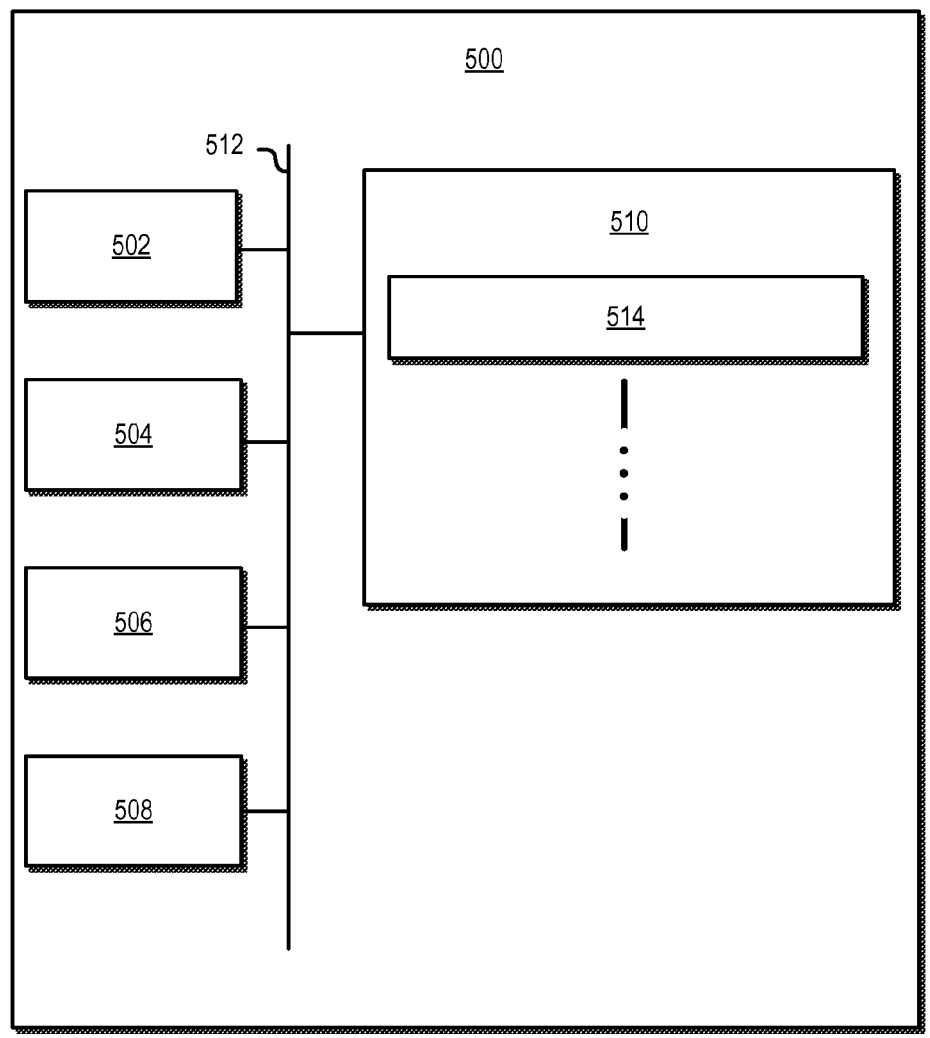
FIG. 5 illustrates an exemplary system for implementing certain embodiments of the systems and methods disclosed herein.

FIG. 5 illustrates an exemplary system 500 for implementing certain embodiments of the systems and methods disclosed herein. In certain embodiments, the computer system 500 may be a personal computer system, a server computer system, an on-board vehicle computer, a battery control system, an external computer system, and/or any other type of system suitable for implementing the disclosed systems and methods. In further embodiments, the computer system 500 may be any portable electronic computer system or electronic device including, for example, a notebook computer, a smartphone, and/or a tablet computer.

As illustrated, the computer system 500 may include, among other things, one or more processors 502, random access memory ("RAM") 504, a communications interface 506, a user interface 508, and a non-transitory computer-readable storage medium 510. The processor 502, RAM 504, communications interface 506, user interface 808, and computer-readable storage medium 510 may be communicatively coupled to each other via a common data bus 512. In some embodiments, the various components of the computer system 500 may be implemented using hardware, software, firmware, and/or any combination thereof.

User interface 508 may include any number of devices allowing a user to interact with the computer system 500. For example, user interface 508 may be used to display an interactive interface to a user. The user interface 508 may be a separate interface system communicatively coupled with the computer system 500 or, alternatively, may be an integrated system such as a display interface for a laptop or other similar device. In certain embodiments, the user interface 508 may be produced on a touch screen display. The user interface 508 may also include any number of other input devices including, for example, keyboard, trackball, and/or pointer devices.

The communications interface 506 may be any interface capable of communicating with other computer systems, peripheral devices, and/or other equipment communicatively coupled to computer system 500. For example, the communications interface 506 may allow the computer system 500 to communicate with other computer systems (e.g., computer systems associated with external databases and/or the Internet), allowing for the transfer as well as reception of data from such systems. The communications interface 506 may include, among other things, a modem, a satellite data transmission system, an Ethernet card, and/or any other suitable device that enables the computer system 500 to connect to databases and networks, such as LANs, MANs, WANs and the Internet.

Processor 502 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 502 may be configured to execute computer-readable instructions stored on non-transitory computer-readable storage medium 510. Computer-readable storage medium 510 may store other data or information as desired. In some embodiments, the computer-readable instructions may include computer executable functional modules 514. For example, the computer-readable instructions may include one or more functional modules configured to implement all or part of the functionality of the systems and methods described above. Specific functional models that may be stored on computer-readable storage medium 510 may include modules to test, monitor, and/or model total performance degradation of a battery system, calendric performance degradation of a battery system, and/or cyclic degradation of a battery system, and/or any other module or modules configured to implement the systems and methods disclosed herein.

The system and methods described herein may be implemented independent of the programming language used to create the computer-readable instructions and/or any operating system operating on the computer system 500. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 500 may be in response to user commands, results of previous processing, or a request made by another processing machine. It will be appreciated that computer system 500 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method of determining a cyclic performance degradation rate of a battery system comprising:
   receiving information indicative of total performance degradation of a battery system over a particular period;
   receiving information indicative of calendric performance degradation of the battery system at a plurality of operating temperatures;
   determining a cyclic degradation of the battery system over the particular period based on the information indicative of the total performance degradation of the battery system and the information indicative of the calendric performance degradation of the battery system;
   determining a cyclic degradation rate based on the cyclic degradation of the battery system over the particular period; and
   estimating a state of the battery system based on the cyclic degradation rate.

2. The method of claim 1, wherein the state of the battery system comprises a state of health of the battery system.

3. The method of claim 1, wherein the state of the battery system comprises a state of charge of the battery system.

4. The method of claim 1, wherein the information indicative of the calendric performance degradation comprises at least one of charge depletion calendric degradation data, charge sustaining calendric degradation data, battery system rest condition calendric degradation data, and battery system recharging calendric degradation data.

5. The method of claim 1, wherein determining the cyclic degradation of the battery system over the particular period is further based on a performance degradation model of the battery system.

6. The method of claim 1, wherein the method further comprises implementing at least one battery system control action based on the determined cyclic degradation rate.

7. The method of claim 6, wherein the control action comprises an action associated with charging operations of the battery system.

8. The method of claim 6, wherein the control action comprises an action associated with discharging operations of the battery system.

9. A method for determining a total performance degradation rate of a battery system comprising:
   determining a calendric performance degradation rate of a battery system at a plurality of operating temperatures;
   determining a cyclic performance degradation rate a battery system at a single operating temperature;
   determining a total performance degradation rate of the battery system based on the calendric performance degradation rate and the cyclic performance degradation rate; and
   estimating a state of the battery system based on the total performance degradation rate.

10. The method of claim 9, wherein the state of the battery system comprises at least one of a state of health of the battery system and a state of charge of the battery system.

11. The method of claim 9, wherein the method further comprises implementing at least one battery system control action based on the determined total performance degradation rate.

12. The method of claim 11, wherein the control action comprises an action associated with charging operations of the battery system.

13. The method of claim 11, wherein the control action comprises an action associated with discharging operations of the battery system.

14. A non-transitory computer-readable medium comprising instructions that, when executed by a processor, cause the processor to perform a method of determining a cyclic degradation rate of a battery system comprising:
   receiving information indicative of total performance degradation of a battery system over a particular period;
   receiving information indicative of calendric performance degradation of the battery system at a plurality of operating temperatures;
   determining a cyclic degradation of the battery system over the particular period based on the information indicative of the total performance degradation of the battery system and the information indicative of the calendric performance degradation of the battery system;

determining a cyclic degradation rate based on the cyclic degradation of the battery system over the particular period; and estimating a state of the battery system based on the cyclic degradation rate.

15. The non-transitory computer-readable medium of claim 14, wherein the state of the battery system comprises at least one of a state of health of the battery system and a state of charge of the battery system.

16. The non-transitory computer-readable medium of claim 14, wherein the information indicative of the calendric performance degradation comprises at least one of charge depletion calendric degradation data, charge sustaining calendric degradation data, battery system rest condition calendric degradation data, and battery system recharging calendric degradation data.

17. The non-transitory computer-readable medium of claim 14, wherein determining the cyclic degradation of the battery system over the particular period is further based on a performance degradation model of the battery system.

18. The non-transitory computer-readable medium of claim 14, wherein the method further comprises implementing at least one battery system control action based on the determined cyclic degradation rate.

19. The non-transitory computer-readable medium of claim 18, wherein the control action comprises at least one of an action associated with charging operations of the battery system and an action associated with discharging operations of the battery system.

\* \* \* \* \*